United States Patent
Tseng

(10) Patent No.: US 6,358,800 B1
(45) Date of Patent: Mar. 19, 2002

(54) METHOD OF FORMING A MOSFET WITH A RECESSED-GATE HAVING A CHANNEL LENGTH BEYOND PHOTOLITHOGRAPHY LIMIT

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/664,477

(22) Filed: Sep. 18, 2000

(51) Int. Cl.[7] ............... H01L 21/336; H01L 21/3205; H01L 21/4763
(52) U.S. Cl. ............ 438/268; 438/270; 438/589; 438/638; 438/639
(58) Field of Search ................. 438/212, 259, 438/268, 270, 271, 272, 589, 637–640

(56) References Cited

U.S. PATENT DOCUMENTS

| | | | |
|---|---|---|---|
| 5,434,093 A | * 7/1995 | Chau et al. | 438/300 |
| 5,448,094 A | * 9/1995 | Hsu | 257/330 |
| 5,668,021 A | * 9/1997 | Subramanian et al. | 438/282 |
| 5,780,340 A | * 7/1998 | Gardner et al. | 438/259 |
| 6,033,980 A | * 7/2000 | Liou et al. | 438/624 |
| 6,087,208 A | * 7/2000 | Krivokapic et al. | 438/183 |
| 6,100,146 A | * 8/2000 | Gardner et al. | 438/301 |
| 6,117,712 A | * 9/2000 | Wu | 438/163 |
| 6,130,454 A | * 10/2000 | Gardner et al. | 257/330 |
| 6,171,916 B1 | * 1/2001 | Sugawara et al. | 438/303 |
| 6,204,128 B1 | * 3/2001 | Hibi et al. | 438/270 |
| 6,204,133 B1 | * 3/2001 | Yu et al. | 438/299 |

\* cited by examiner

Primary Examiner—Carl Whitehead, Jr.
Assistant Examiner—Toniae M. Thomas
(74) Attorney, Agent, or Firm—Blakely, Sokoloff Taylor & Zafman, LLP

(57) ABSTRACT

A method of forming a MOSFET having a recessed-gate with a channel length beyond the photolithography limit is disclosed in the present invention. First, a first dielectric layer and a second dielectric layer are formed on a semiconductor substrate. A first opening is next formed in the second dielectric layer. After forming first spacers on sidewalls of the first opening and removing the first dielectric layer within the first opening, a trench is formed in the semiconductor substrate by an anisotropic etching process. After forming second spacers with dopant source material on sidewalls of the trench, a gate dielectric layer is formed within the trench. A conductive layer is formed to refill said trench. After removing the portion of the conductive layer outside the trench, a gate plug is then formed. After removing the second dielectric layer, source and drain regions and source/drain extensions are formed

8 Claims, 6 Drawing Sheets

METHOD OF FORMING A MOSFET WITH A RECESSED-GATE HAVING A CHANNEL LENGTH BEYOND PHOTOLITHOGRAPHY LIMIT

BACKGROUND OF THE INVENTION (1) Field of the Invention

The present invention relates generally to a method of manufacturing a MOSFET with a recessed-gate, and more particularly, to a method of forming a MOSFET with a recessed-gate having a channel length beyond the photolithography limit.

(2) Description of the Related Art

Integrated circuits (ICs), such as ultra-large scale integrated (ULSI) circuits, can include as many as one billion transistors or more. The ULSI circuits are generally composed of complementary metal oxide semiconductor field effect transistors (MOSFETs). Each MOSFET contains a gate electrode disposed between a drain region and a source region. In order to increase the device density and operating speed of the integrated circuits, the feature size of transistors within the circuits must be shrunk down. Particularly, in scaling down devices, a P-channel or an N-channel with shorter channel length is needed to enhance the operating speed.

Generally, photolithography process is a critical technique for shortening the channel length of a MOSFET. It is believed that the achievable minimum channel length depends on the photolithography limit of the lithographic tool, e.g. a stepper or a scanner.

Figure 1:
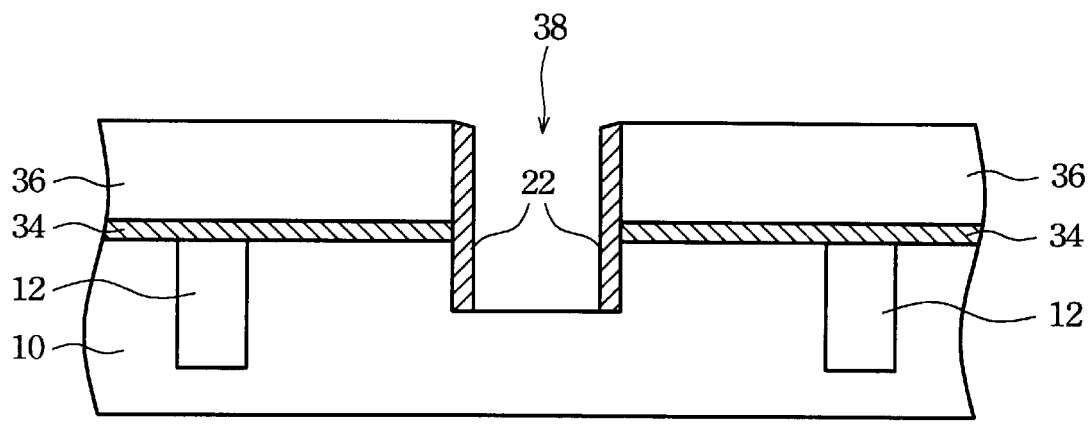
Figure 1:
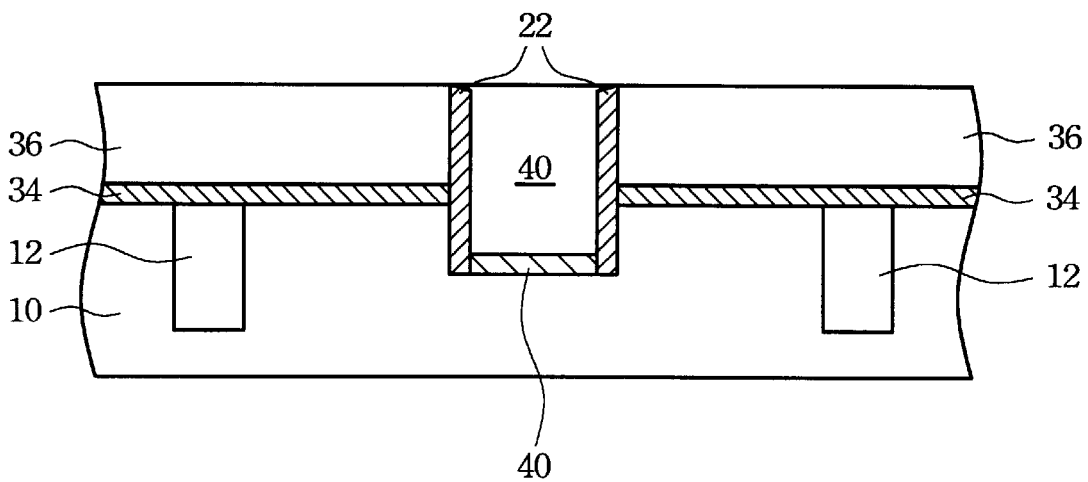
Figure 1:
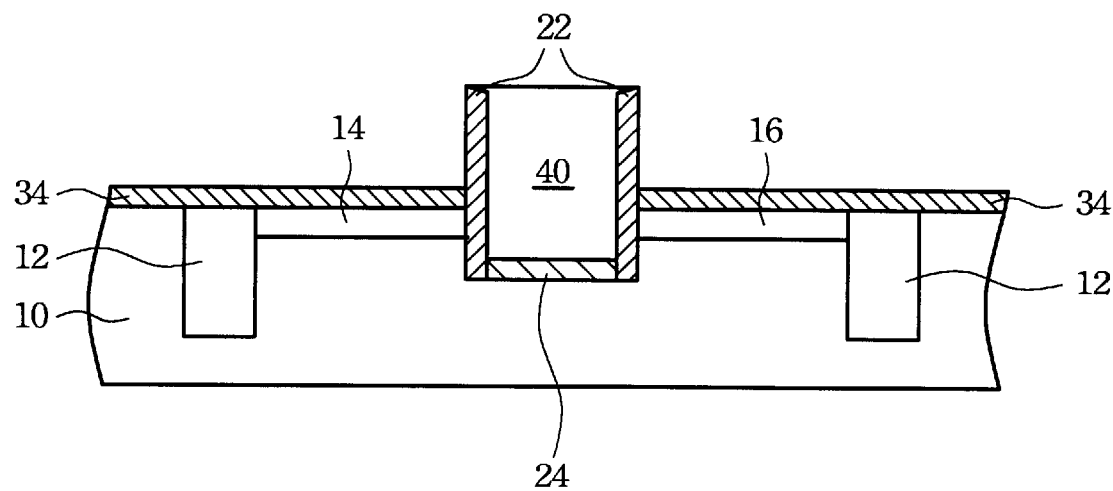
Figure 1:
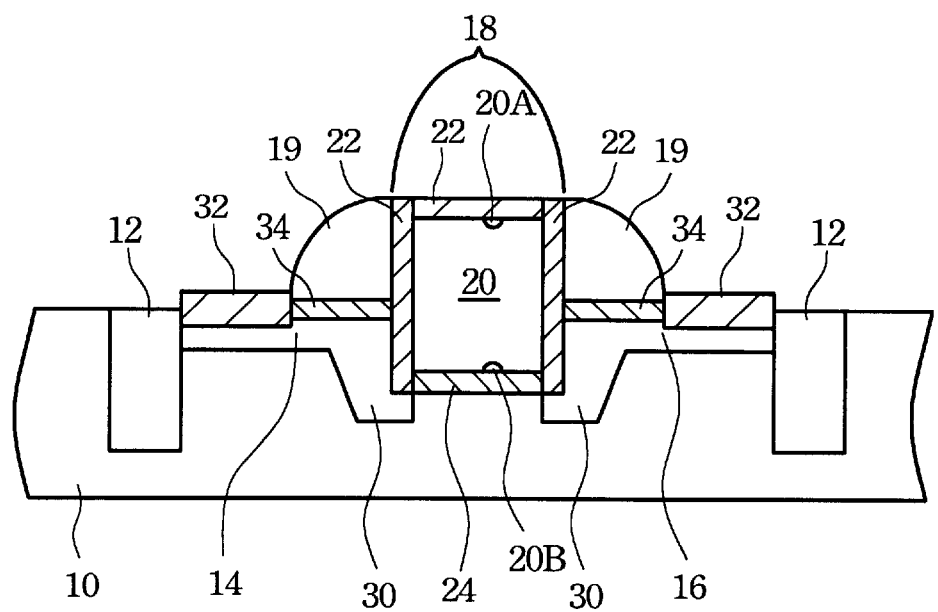

In order to succeed at sub-0.1 $\mu$m gate dimensions and below, a recessed-gate MOSFET with out-diffused source/drain extension was disclosed in U.S. Pat. No. 6,093,947. Referring first to FIG. 1A, according to this prior art, a semiconductor wafer 10 with a plurality of shallow trench isolation (STI) 12 is provided. A pad oxide layer 34 and a dielectric layer 36 are formed on the semiconductor wafer 10. Next, a hole 38 is formed in the structure extending into the semiconductor wafer 10. The hole 38 has sidewalls and a bottom wall. Thereafter, oxide spacer regions 22 are formed on the sidewall of the hole 38, wherein the oxide spacer regions 22 contain a dopant material which can out-diffuse when subjected to annealing.

Referring now to FIG. 1B, a gate oxide region 24 is formed on the bottom wall of the hole 38. After that, a conformal layer of polysilicon 40 is formed in the hole 38 and on the dielectric layer 36, and then a CMP process is performed to remove the polysilicon layer 40 outside the hole 38, as shown in FIG. 1B.

Referring now to FIG. 1C, the dielectric layer 36 is removed to expose the pad oxide layer 34 and outer walls of the oxide spacer regions 22. Source/drain regions 14/16 are formed in the semiconductor wafer 10 adjacent to the hole 38.

Finally, as shown in FIG. 1D, an annealing process is performed to cause out-diffusion of the dopant from the oxide spacer regions 22 to the semiconductor wafer 10 so as to form an extension 30 which wraps around the oxide spacer regions 22 and provides a connection to a channel region which is located beneath the gate oxide region. After that, nitride double spacers 19 are formed over the pad oxide layer 34. Finally, metal contacts, i.e. regions 32 and 26, are formed in the structure.

However, according to the prior art, the achievalble minimum channel length equals to the photolithography limit, when the photolithography process for forming the hole 38 is performed under the photolithography limit. In order to obtain shorter channel length for improving operating speed, it will be necessary to develop a new technology for forming a MOSEET.

SUMMARY OF THE INVENTION

Accordingly, it is a primary object of the present invention to provide a method of forming a MOSFET with a recessed-gate having a channel length beyond the photolithography limit.

It is another object of the present invention to provide a method of forming a MOSFET with a recessed-gate.

A method of forming a MOSFET having a recessed-gate with a channel length beyond the photolithography limit is disclosed in the present invention. First, a first dielectric layer and a second dielectric layer are formed on a semiconductor substrate, wherein the first dielectric layer and the second dielectric layer have selective etchability. For example, the first dielectric layer is composed of silicon dioxide and the second dielectric layer is composed of silicon nitride or silicon oxynitride. The second dielectric layer has a thickness between 1000 to 2000 Angstroms.

Next, a first opening is formed in the second dielectric layer. After forming first spacers on sidewalls of the first opening and removing the first dielectric layer within the first opening, a trench is formed in the semiconductor substrate by an anisotropic etching process. After forming second spacers with dopant source material on sidewalls of the trench, a gate dielectric layer is formed within the trench.

Thereafter, a conductive layer is formed to refill said trench. After removing the portion of the conductive layer outside the trench, a gate plug is then formed. After removing the second dielectric layer, source and drain regions are formed by an ion implantation process. After that, source/drain extensions are formed by an annealing process to out-diffuse the dopant material to the semiconductor substrate.

Finally, after forming third spacers on sidewalls of the first spacers, metal contacts for the source and drain regions and the gate plug are formed.

BRIER DESCRIPTION OF THE DRAWINGS

The accompanying drawings forming a material part of this description, in which

FIG. 1A to FIG. 1D schematically illustrates the cross-sectional diagram of the method of forming a MOSFET with a recessed-gate according to the prior art.

FIG. 2A to FIG. 2J schematically illustrate the cross-sectional diagram of the method of forming a MOSFET with a recessed-gate having a channel length beyond the photolithography limit according to the present invention.

DESCRIPTION OF THE PREFERRED EMBODIMENTS

The present invention relates generally to a method of manufacturing a MOSFET with a recessed-gate, and more particularly, to a method of forming a MOSFET with a recessed-gate having a channel length beyond the photolithography limit.

Figure 2:
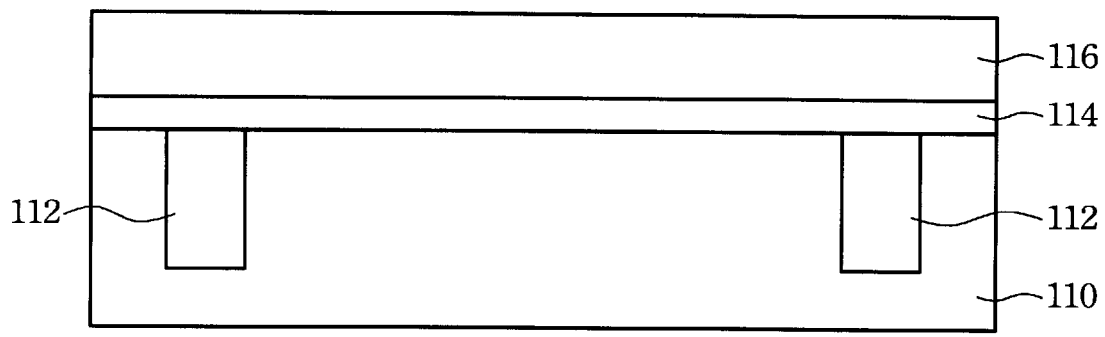
Figure 2:
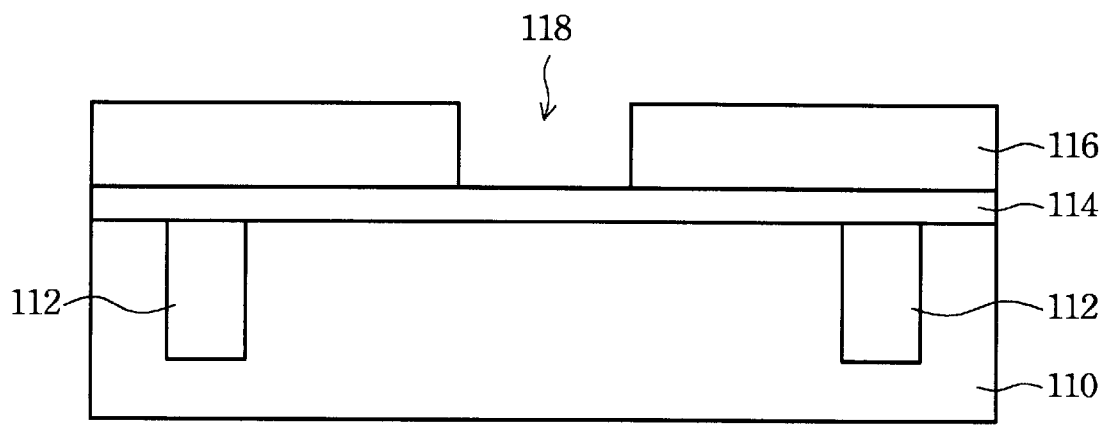
Figure 2:
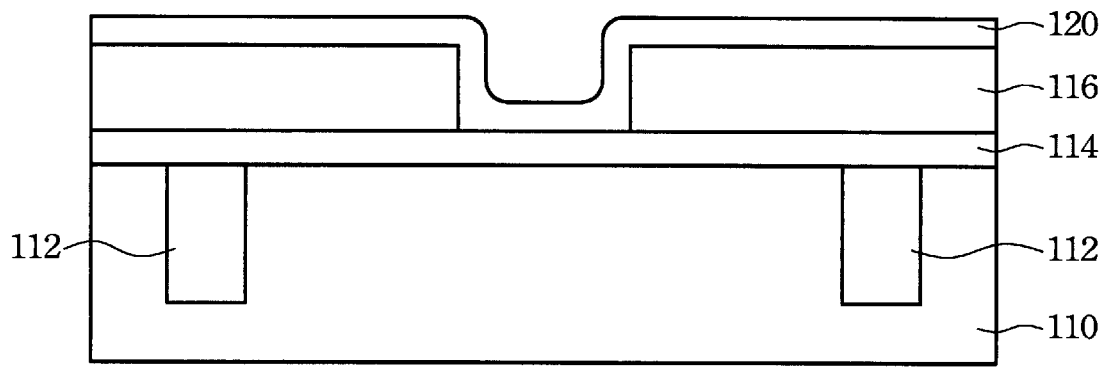
Figure 2:
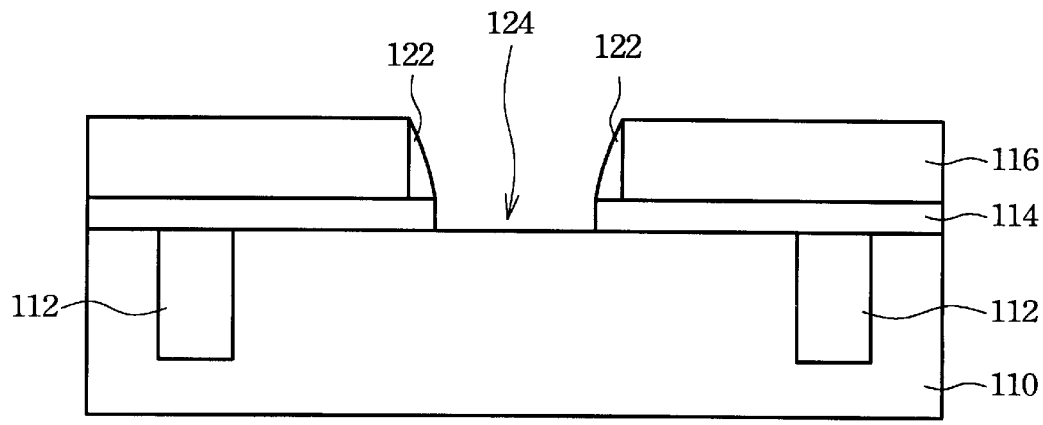
Figure 2:
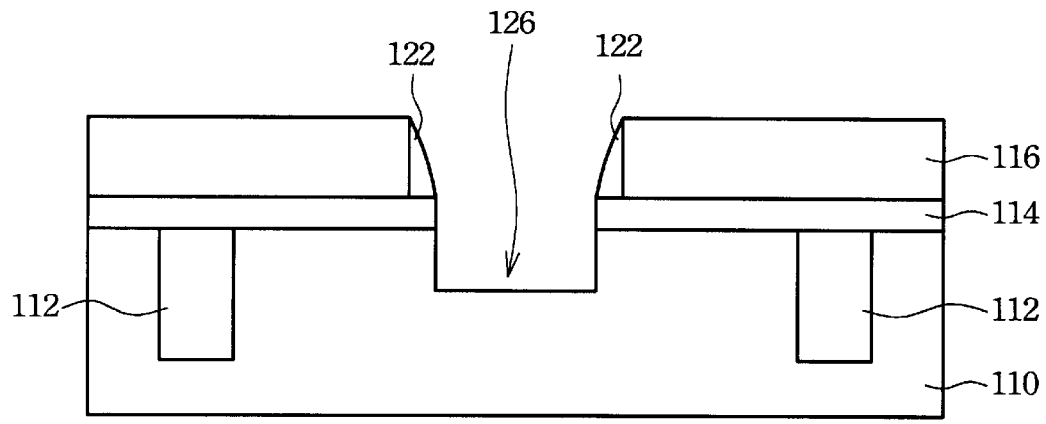
Figure 2:
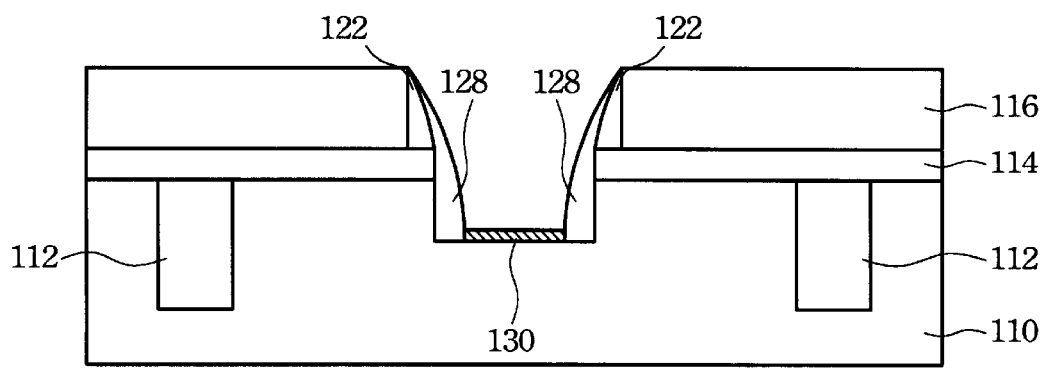
Figure 2:
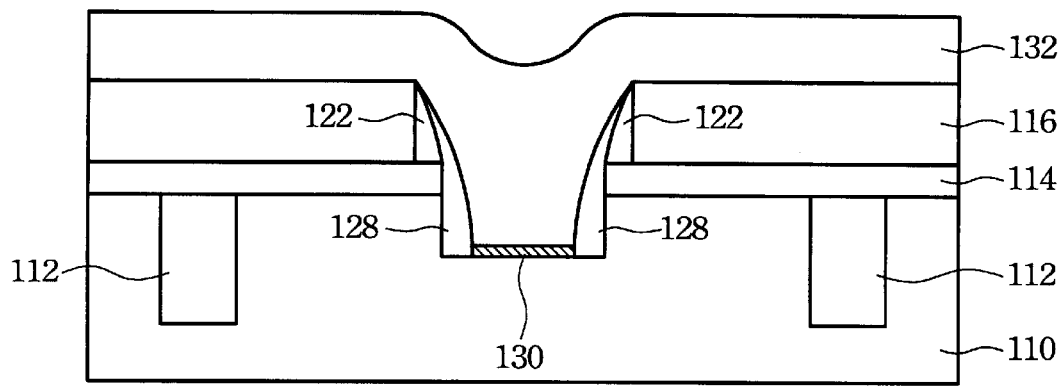
Figure 2:
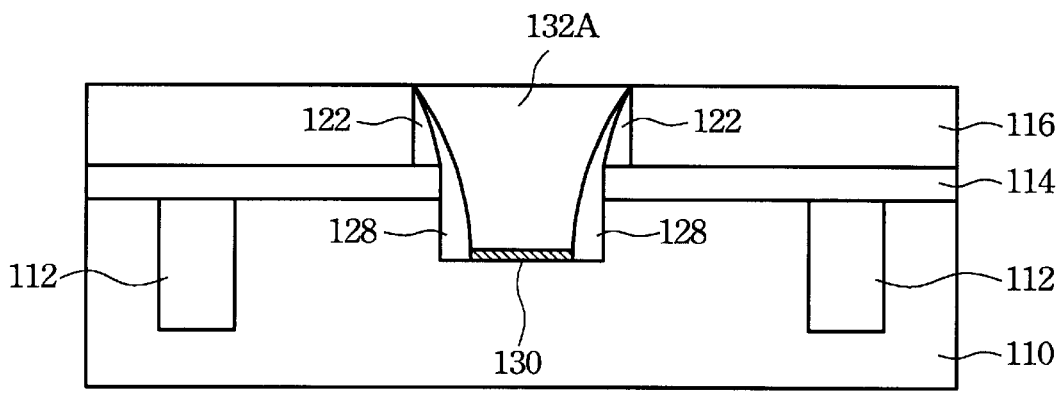
Figure 2:
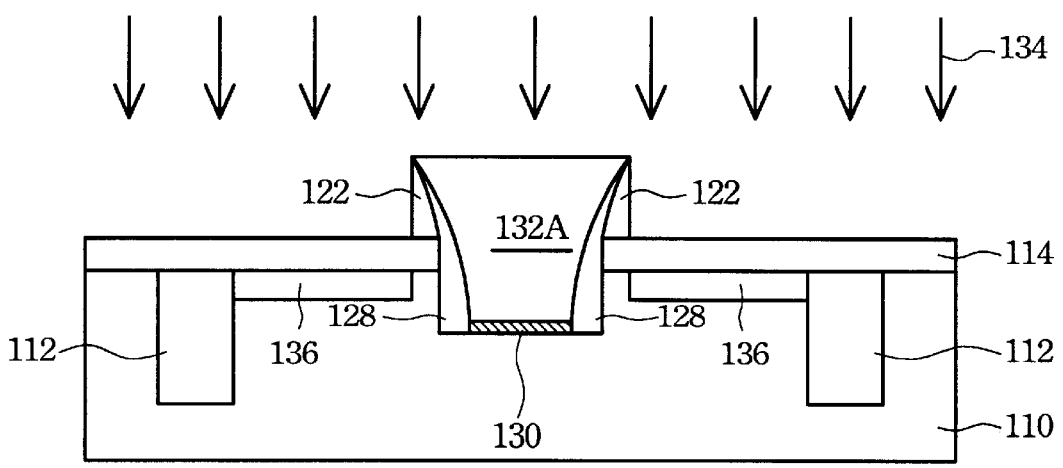
Figure 2:
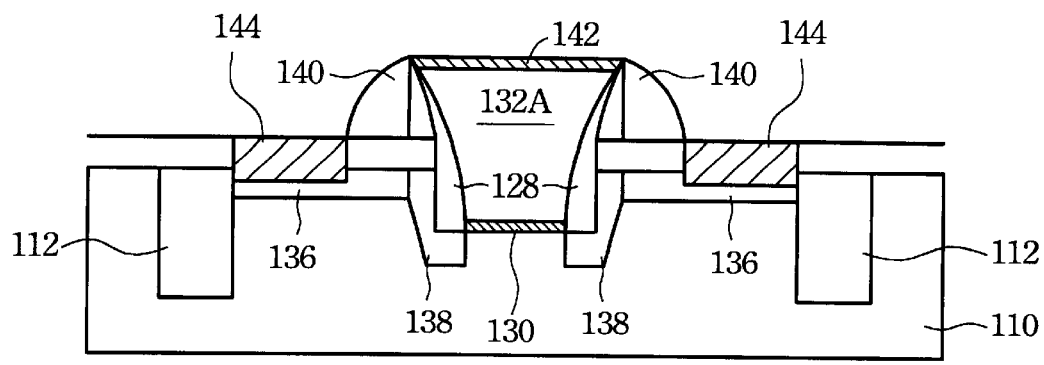

Referring first to FIG. 2A, a semiconductor substrate 110 comprised of P-type single crystalline silicon is provided. Shallow trench isolation regions (STI) 112 are next formed in the semiconductor substrate 110. After that, a first dielectric layer 114 and a second dielectric layer 116 are formed on the semiconductor substrate 110 in sequence.

The shallow trench isolation regions 112 are formed by first forming shallow trenches in the semiconductor substrate 110 using the conventional photolithographic and anisotropic reactive ion etching (RIE) procedures. After removal of the photoresist shape used to define the shallow trenches, a silicon oxide layer is deposited by low pressure chemical vapor deposition (LPCVD) or plasma enhanced chemical vapor deposition (PECVD) procedures for completely filling the shallow trenches. A chemical mechanical polishing (CMP) process is then performed to remove silicon oxide from the top surface of the semiconductor substrate 110. The first dielectric layer 114 is formed by conventional deposition process such as PECVD or LPCVD to a thickness between 50 to 200 Angstroms. The first dielectric layer 114 is composed of silicon dioxide ($SiO_2$), $TiO_2$, $Ta_2O_5$ and the like. The second dielectric layer 116 is composed of silicon nitride or silicon oxynitride, and deposited by a low-pressure CVD (LPCVD) process or a plasma-enhanced CVD (PECVD) process to a thickness between 1000 to 2000 Angstroms. The first dielectric layer and the second dielectric layer should have selective etchability.

As shown in FIG. 2B, a first opening 118 is formed in the second dielectric layer 116 by the conventional lithography and anisotropic etching techniques. The etching process is stopped on the top surface of the first dielectric layer 114. In one embodiment of the present invention, the lithography process is performed under the photolithography limit.

Referring now to FIG. 2C, a third dielectric layer 120, composed of silicon dioxide, is deposited on the second dielectric layer 116 and in the first opening 118.

Referring now to FIG. 2D, first oxide spacers 122 are formed on the sidewalls of the first opening 118 by performing an anisotropic RIE process using $CHF_3$ as an etchant. The first dielectric layer 114 in the first opening 118 is also removed during the etching process, and a second opening 124 is simultaneously formed. The width of the second opening 124 is smaller than that of the first opening 118, as shown in FIG. 2D.

Referring now to FIG. 2E, an anisotropic RIE process using $Cl_2$ as the etchant is performed to the semiconductor substrate 110 through the second opening 124, and a trench 126 is formed. Because the etchant $Cl_2$ is blocked by the first oxide spacers 122 and the second dielectric layer 116, the width of the trench 126 is less than that of the first opening 118 and thus beyond the photolithography limit, in case the first opening 18 is formed under the photolithography limit.

Referring now to FIG. 2F, second oxide spacers 128 containing a dopant source material are formed on the sidewalls of the trench 126. A wet etching process is next performed to remove the surface defect of the silicon substrate. Thereafter, a gate dielectric layer 130 is next formed on the semiconductor substrate 110 within the trench 126.

During the processes for forming the second oxide spacers 128, an oxide layer with a dopant source material is first deposited by a conventional deposition process such as PECVD or LPCVD. Thereafter, an anisotropic RIE process is performed to form the second oxide spacers 128. The second oxide spacers 128 contain a P-type (e.g. B) or N-type (e.g. As, P) dopant source material, so that the dopant material can be out-diffused from the second oxide spacers 128 into the semiconductor substrate 110 by annealing. The wet etching process is performed by a mixed solution of $NH_4F$ and HF, which shall etch silicon substrate only. The gate dielectric layer 130 is comprised of silicon dioxide or nitrogen-rich oxide with a thickness between 10 to 50 Angstroms by a thermal oxidation process or a chemical vapor deposition process.

As shown in FIG. 2G, an electric conductive layer132 is deposited on the gate dielectric layer 130, the second oxide spacers 128, and the second dielectric layer 116 to a thickness between 1000 to 3000 Angstroms. The electric conductive layer 132 is a conformal layer of doped polysilicon and formed by a LPCVD or a PECVD process. The polysilicon can be doped in-situ during deposition via the addition of boron, arsine, or phosphine to a silane ambient. On the other hand, the electric conductive layer 132 can be first deposited intrinsically, and then doped via an ion implantation process.

As shown in FIG. 2H, an electric layer plug 132A is formed within the trench 126 by a planarization process such as CMP process to remove the portion of the electric conductive layer outside the trench 126.

Referring now to FIG. 2I, a selective etching process is performed to remove the second dielectric layer 116. After that, an ion implantation process is performed to introduce dopant ions 134 to form source/drain regions 136.

The selective etching process is performed by a wet etching process such as a hot phosphoric etch. The dose of the dopant ions 132 in the source/drain regions 136 ranges from 2E15 to 9E15 ions/$cm^2$ of the appropriate dopant ions 134, e.g., arsenic (As) or phosphorous (P) for an illustrative N-channel MOSFET (NMOS transistor) or boron (B) for an illustrative P-channel MOSFET (PMOS transistor). The implant energy of the dopant ions 134 ranges from approximately 15 to 25 keV. The dopant ions can thus be implanted to a depth of between 1000 to 2000 Angstroms within the semiconductor substrate 110.

Referring now to FIG. 2J, an annealing process is first performed to out-diffuse the dopant source material in the second oxide spacers 128 into the semiconductor substrate 110 to form source/drain extensions 138. The annealing process is generally performed by a rapid thermal annealing process (RTA). The source/drain extensions 138 wraps around the second oxide spacers 128 and connect the source/drain regions 136 to the channel which is located beneath the gate dielectric layer 130.

After that, third dielectric spacers 140 are formed on the sidewalls of the first oxide spacers 122 by performing a conventional deposition process, followed by an etch-back process.

Finally, a metal contact of the gate electrode 142 and the metal contacts of the source/drain electrodes 144 are formed by a series of conventional processes of deposition, photolithography, and etching procedures. The metal contacts are compose of, but not limited to: W, Al/Cu alloy, Cu, and the like. The metal contacts can be deposited by a variety of techniques, such as high-density inductively coupled plasma (ICP) deposition, high-density ionized metal plasma (IMP) deposition, CVD, sputtering and the like.

The key feature of the present invention is that the width of the channel of the MOSFET, which is located beneath the gate dielectric layer 130, is less than that of the first opening 118, whose achievable minimum width equals to the photolithography limit. For this reason, the channel length of the recessed-gate according to the present invention is beyond the photolithography capability. The shrinkage amount of the channel length depends on the width of the first oxide spacers 122 and thus on the thickness of the second dielectric layer 116. The shrinkage amount of the channel length beyond the photolithography limit ranges between 200 to 500 Angstroms (0.02 um to 0.05 um). [please confirm it]

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What we claimed is:

1. A method of forming a MOSFET having a recessed-gate with a channel length beyond photolithography limit, the method comprising:
   a. forming a first dielectric layer and a second dielectric layer on a semiconductor substrate, wherein said first dielectric layer and said second dielectric layer have selective etchability;
   b. forming a first opening in said second dielectric layer;
   c. forming first spacers on sidewalls of said first opening and removing said first dielectric layer within said first opening;
   d. forming a trench in said semiconductor substrate by an anisotropic etching process;
   e. forming second spacers with dopant source material on sidewalls of said trench;
   f. forming a gate dielectric layer within said trench;
   g. forming a conductive layer to refill said trench;
   h. removing a portion of said conductive layer outside said trench to form a gate plug;
   i. removing said second dielectric layer;
   j. forming source and drain regions and source/drain extensions;
   k. forming third spacers on sidewalls of said first spacers; and
   l. forming metal contacts for said source/drain regions and said gate plug.

2. The method of claim 1, wherein said first opening is formed by a photolithography and an anisotropic etching processes, wherein said etching process is stopped on a top surface of said first dielectric layer.

3. The method of claim 1, wherein said gate dielectric layer is formed by thermal oxidation process.

4. The method of claim 3, wherein said gate dielectric layer has a thickness between 10 to 50 Angstroms.

5. The method of claim 1, wherein said portion of said conductive layer outside said trench is removed by performing a chemical mechanical polishing process.

6. The method of claim 1, wherein said source and drain regions are formed by an ion implantation process.

7. The method of claim 1, wherein said source/drain extensions are formed by performing an annealing process to out-diffuse said dopant source material contained in said second spacers.

8. The method of claim 1, wherein said first spacer, said second spacers and said third spacers are formed by first depositing an insulator layer and then performing an anisotropic etching process.

* * * * *